United States Patent
Sugiyama

(10) Patent No.: US 9,212,468 B2
(45) Date of Patent: Dec. 15, 2015

(54) EXCAVATOR

(75) Inventor: Yuta Sugiyama, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 216 days.

(21) Appl. No.: 13/978,896

(22) PCT Filed: Jan. 26, 2012

(86) PCT No.: PCT/JP2012/051709
§ 371 (c)(1),
(2), (4) Date: Jul. 10, 2013

(87) PCT Pub. No.: WO2012/102352
PCT Pub. Date: Aug. 2, 2012

(65) Prior Publication Data
US 2013/0282241 A1    Oct. 24, 2013

(30) Foreign Application Priority Data

Jan. 28, 2011   (JP) .................................. 2011-016546

(51) Int. Cl.

| | | |
|---|---|---|
| G06F 17/00 | (2006.01) | |
| E02F 9/20 | (2006.01) | |
| E02F 9/12 | (2006.01) | |
| E02F 9/26 | (2006.01) | |
| H01M 10/44 | (2006.01) | |
| H01M 10/0525 | (2010.01) | |

(Continued)

(52) U.S. Cl.
CPC .............. *E02F 9/2025* (2013.01); *E02F 9/123* (2013.01); *E02F 9/2091* (2013.01); *E02F 9/268* (2013.01); *H01M 10/44* (2013.01); *G01R 31/028* (2013.01); *G01R 31/361* (2013.01); *H01M 10/0525* (2013.01)

(58) Field of Classification Search
None
See application file for complete search history.

(56) References Cited

U.S. PATENT DOCUMENTS

2009/0128159 A1   5/2009 Nakatsuji
2011/0000722 A1*  1/2011 Kawashima ............... 180/65.28
(Continued)

FOREIGN PATENT DOCUMENTS

| JP | 09-292918 | 11/1997 |
|---|---|---|
| JP | 2008-253064 | 10/2008 |

(Continued)

OTHER PUBLICATIONS

International Search Report mailed on May 1, 2012.

*Primary Examiner* — Thomas Tarcza
*Assistant Examiner* — Garrett Evans
(74) *Attorney, Agent, or Firm* — IPUSA, PLLC

(57) ABSTRACT

An electrical energy storage unit (120) of an excavator includes an electrical energy storage device (19) that accumulates electric power generated by a generator and an electric circuit that controls a charge/discharge operation of the electrical energy storage device. An abnormality detection part detects an abnormality of the electrical energy storage unit (120). An electrical energy storage state estimation part of the abnormality detection part obtains an estimation value of an electrical energy storage state of the electrical energy storage device (19) based on a voltage detection value obtained by a voltage detection part and a current detection value obtained by a current detection part. An abnormality determination part of the abnormality detection part makes an abnormality determination based on the estimation value obtained by the electrical energy storage state estimation part.

12 Claims, 11 Drawing Sheets

(51) Int. Cl.
    *G01R 31/36*     (2006.01)
    *G01R 31/02*     (2006.01)

(56) References Cited

U.S. PATENT DOCUMENTS

2012/0016547 A1*   1/2012   Aridome et al. ............... 701/22
2012/0130576 A1     5/2012   Sugiyama et al.

FOREIGN PATENT DOCUMENTS

| | | |
|---|---|---|
| JP | 2009-303306 | 12/2009 |
| JP | 2010-015831 | 1/2010 |
| JP | 2010-200574 | 9/2010 |
| JP | 2010-226782 | 10/2010 |
| WO | 2007/142195 | 12/2007 |
| WO | WO 2010/100736 | 9/2010 |
| WO | WO 2011/007805 | 1/2011 |

* cited by examiner

EXCAVATOR

TECHNICAL FIELD

The present invention relates to an excavator that drives an electric work element with electric power from an electrical energy storage device.

BACKGROUND ART

Construction machines such as an excavator having an electric work element such as a turning mechanism that is driven by an electric motor generally include an electrical energy storage unit including an electrical energy storage device for supplying electric power to the electric work element. Such an electrical energy storage unit including an electrical energy storage device is generally accommodated inside a small chassis. Because heat generated by the electrical energy storage unit and/or heat from the exterior are trapped within the chassis, the atmospheric temperature of the electrical energy storage unit is oftentimes higher than the normal temperature. When the atmospheric temperature of the electrical energy storage unit is high, the electrical energy storage device may be prone to degradation and an electric circuit of the electrical energy storage unit may be prone to failure, for example.

In this respect, a technique has been proposed that involves using an IPM (intelligent power module) in a voltage step-up/down converter that charges/discharges an electrical energy storage device of an electrical storage to prevent a power device of the voltage step-up/down converter (a part of an electric energy storage unit) from overheating (See e.g., Japanese Unexamined Patent Publication No. 2010-226782).

RELATED ART DOCUMENT

Patent Document

Patent Document 1: Japanese Unexamined Patent Publication No. 2010-226782

DISCLOSURE OF THE INVENTION

Problem to be Solved by the Invention

For example, a case may be contemplated where a voltmeter for detecting the voltage of an electrical energy storage device of an electrical energy storage unit is broken, the voltage of the electrical energy storage device cannot be accurately detected, and the voltage value is indicated as zero. In such a case, even though the actual voltage of the electrical energy storage device is not zero (i.e., the electrical energy storage device is charged), a control unit of the construction machine may erroneously determine that the voltage value of the electrical energy storage device is zero and prompt initial charging of the electrical energy storage device. When such initial charging of the electrical energy storage device is performed in this case, the electrical energy storage device may be continually charged to thereby be overcharged because the detection value for the voltage of the electrical energy storage device remains zero even when the electrical energy storage device is fully charged. In the worst case scenario the electrical energy storage device may be degraded as a result of such charging operations.

Accordingly, there is a demand for a technique for enabling easy determination of an abnormality of an electrical energy storage unit including an electrical energy storage device in order to respond to such abnormality of the electrical energy storage unit or the electrical energy storage device.

Means for Solving the Problem

According to an embodiment of the present invention, an excavator is provided that includes an arm including an attachment, a boom to which the arm is attached, an upper turning body to which the boom is attached, an engine arranged at the upper turning body, an electrical energy storage unit including an electrical energy storage device that accumulates electric power generated by a generator and an electric circuit that controls a charge/discharge operation of the electrical energy storage device, a voltage detection part that is arranged between the electrical energy storage device and the generator and is configured to measure a voltage of the electrical energy storage device, a current detection part that measures a current flowing through the electrical energy storage device, and an abnormality detection part that detects an abnormality of the electrical energy storage unit. The abnormality detection part includes an electrical energy storage state estimation part that obtains an estimation value of an electrical energy storage state of the electrical energy storage device based on a voltage detection value obtained by the voltage detection part and a current detection value obtained by the current detection part, and an abnormality determination part that makes an abnormality determination based on the estimation value obtained by the electrical energy storage state estimation part.

Effects of the Invention

According to an aspect of the present invention, an abnormality of an electrical energy storage unit including an electrical energy storage device may be easily determined.

MODE FOR CARRYING OUT THE INVENTION

In the following, preferred embodiments of the present invention are described with reference to the accompanying drawings.

Figure 1:
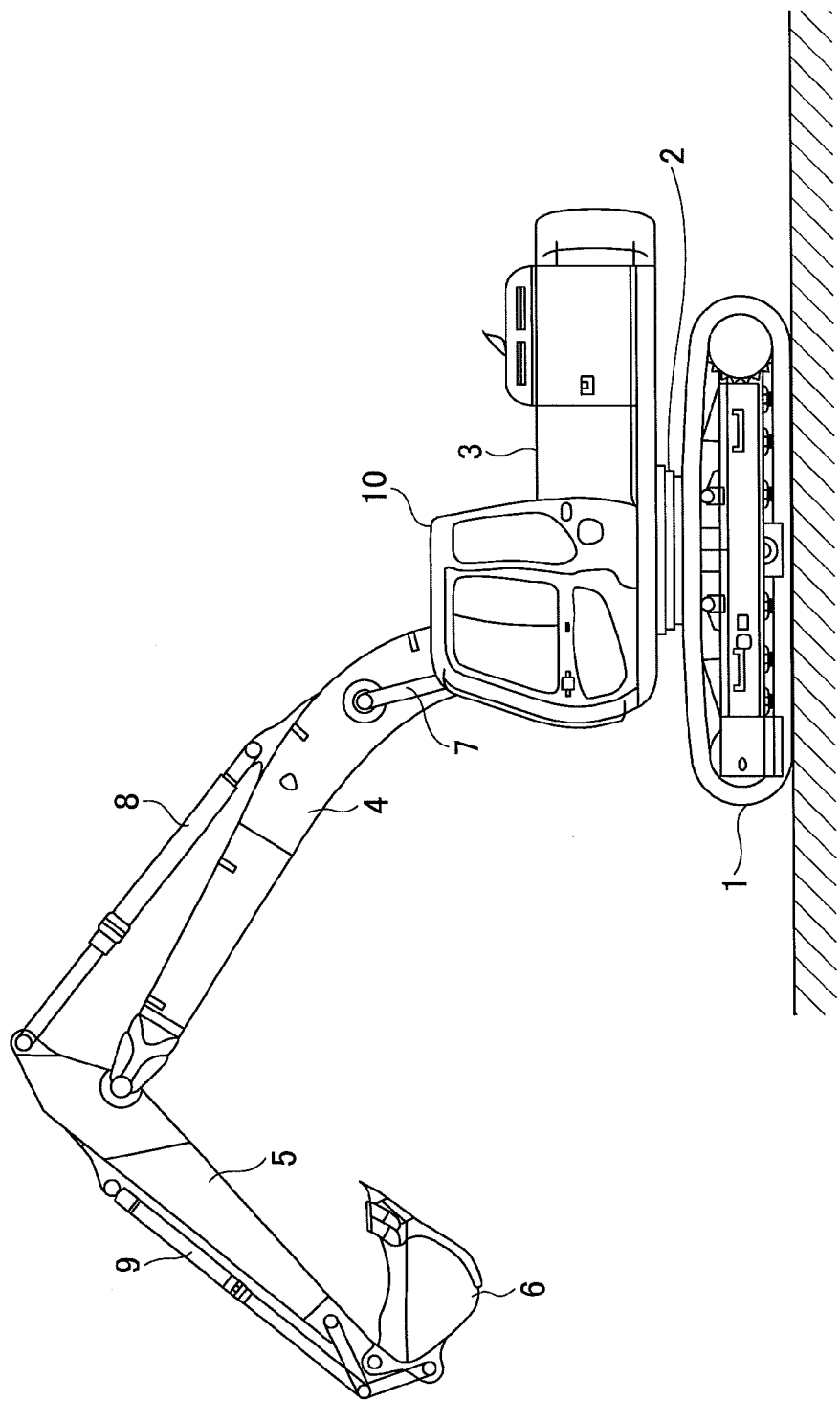
FIG. 1 is a side view of a hybrid excavator.

FIG. 1 is a side view of a hybrid excavator to which an embodiment of the present invention is implemented. It is noted that the excavator implementing an embodiment of the present invention is not limited to a hybrid excavator. That is, the present invention may be implemented in any type of excavator that is configured to drive an electric work element or an electric load using electric power from an electrical energy storage unit.

An upper turning body 3 is mounted, via a turning mechanism 2, on the lower running body 1 of the hybrid excavator illustrated in FIG. 1. A boom 4 is attached to the upper turning body 3. An arm 5 is attached at the end of the boom 4. A bucket 6 is attached at the end of the arm 5. The boom 4, the arm 5, and the bucket 6 are hydraulically driven by a boom cylinder 7, an arm cylinder 8, and a bucket cylinder 9, respectively. A cabin 10 is arranged in the upper turning body 3, and a power source, such as an engine, is mounted to the upper turning body 3.

Figure 2:
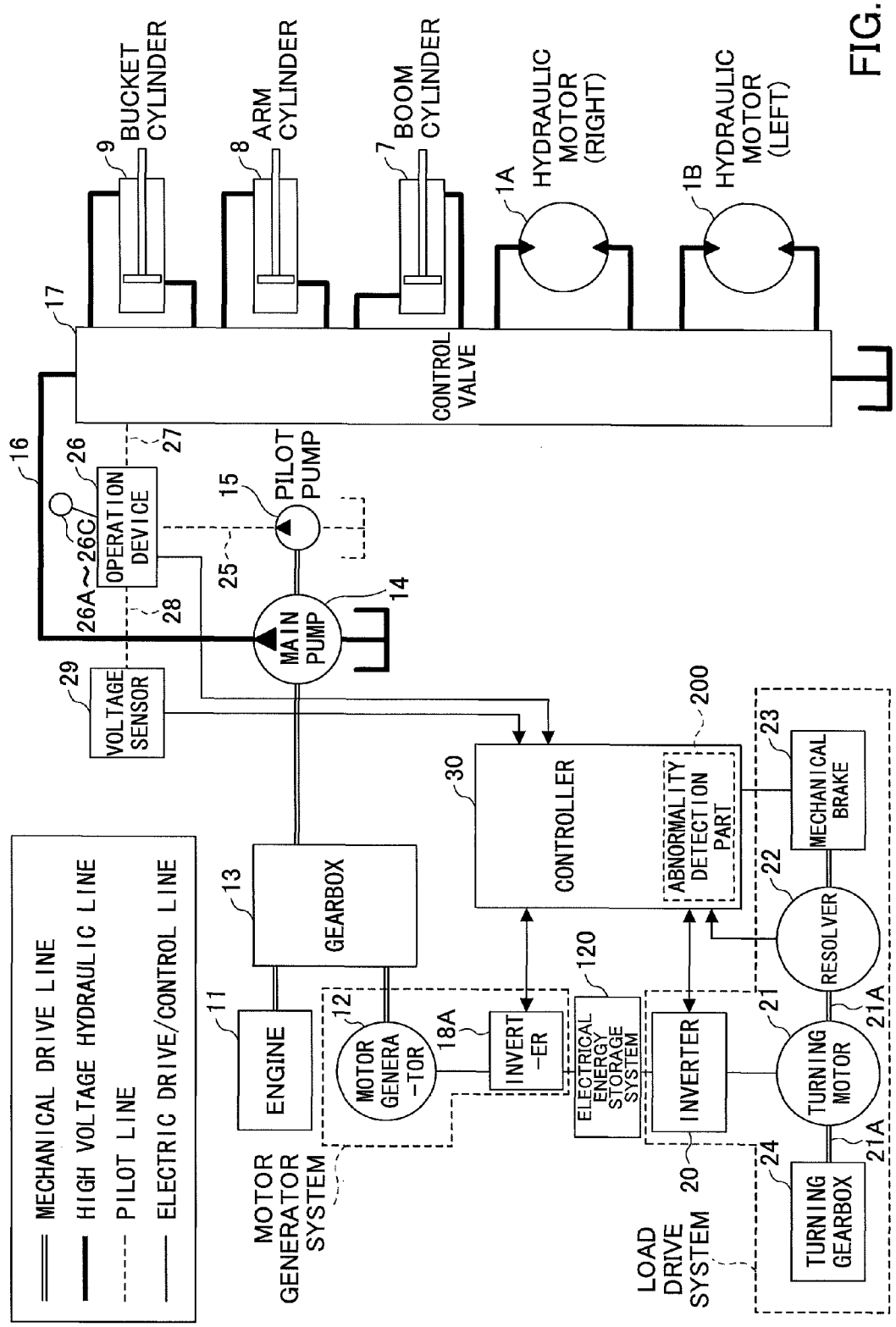
FIG. 2 is a block diagram illustrating a configuration of a drive system of a hybrid excavator according to an embodiment of the present invention.

FIG. 2 is a block diagram showing a configuration of a drive system of a hybrid excavator according to an embodiment of the present invention. In FIG. 2, the double line denotes a mechanical drive line, the thick solid line denotes a high voltage hydraulic line, the dotted line denotes a pilot line, and the thin solid line denotes an electric drive/control line.

An engine 11 as a mechanical drive part and a motor generator 12 as an assist drive part are connected to two input axes of a gearbox 13, respectively. A main pump 14 as a hydraulic pump and a pilot pump 15 are connected to the output axis of the gearbox 13. A control valve 17 is connected to the main pump 14 via a high voltage hydraulic line 16. The hydraulic pump 14 corresponds to a variable displacement hydraulic pump that is capable of controlling a fluid flow rate by controlling the angle (tilt angle) of a swash-plate to adjust a piston stroke length.

The control valve 17 is a control unit that controls a hydraulic system of the hybrid excavator. A hydraulic motor 1A (for the right side) and a hydraulic motor 1B (for the left side) are provided for driving the lower running body 1. The hydraulic motors 1A and 1B, the boom cylinder 7, the arm cylinder 8, and the bucket cylinder 9 are connected to the control valve 17 via the high voltage hydraulic line.

An electrical energy storage system (electrical energy storage unit) 120 including an electrical energy storage device is connected to the motor generator 12 via an inverter 18A. An operation device 26 is connected to the pilot pump 15 via the pilot line 25. The operation device 26 includes a lever 26A, a lever 26B, and a pedal 26C. The lever 26A, the lever 26B, and the pedal 26C are connected to each of the control valve 17 and a voltage sensor 29 via a hydraulic line 27 and a hydraulic line 28, respectively. The voltage sensor 29 is connected to a controller 30, and the controller 30 performs drive control of an electric system.

The controller 30 controls operations of the motor generator 12 (switching of a motor-assisted operation and a power generating operation), and controls operations of an up-down voltage converter corresponding to a voltage raising/lowering control unit to control charge/discharge operations of an electrical energy storage device (e.g., capacitor). The controller 30 controls switching of the voltage raising operation and the voltage lowering operation of the up-down voltage converter based on the charge state (e.g., charge rate) of the electrical energy storage device (e.g., capacitor) and the operating state of the motor generator 12 (motor-assisted operation or power generating operation) so that charge/discharge operations of the electrical energy storage device (e.g., capacitor) may be controlled.

The switching control between the voltage raising operation and the voltage lowering operation of the up-down voltage converter is carried out based on a DC bus voltage value detected by a DC bus voltage detection part, an electrical energy storage device voltage value detected by an electrical energy storage device voltage detection part, and an electrical energy storage device current value detected by an electrical energy storage device current detection part.

Also, the charge state (e.g., charge rate SOC) of the electrical energy storage device (e.g., capacitor) is calculated based on the electrical energy storage device voltage value detected by the electrical energy storage device voltage detection part. It is noted that although a capacitor is illustrated as an exemplary electrical energy storage device, a chargeable and dischargeable secondary battery such as a lithium ion battery or some other form of power supply that can deliver and receive electric power may be used as the electrical energy storage device instead of a capacitor.

The turning mechanism 2 of the hybrid excavator illustrated in FIG. 2 is electrically-driven, and a turning motor 21 is provided for driving the turning mechanism 2. The turning motor 21 as an electric work element is connected to the electrical energy storage system 120 via an inverter 20. A resolver 22, a mechanical brake 23, and a turning gearbox 24 are connected to the axis of rotation 21A of the turning motor 21. The turning motor 21, the inverter 20, the resolver 22, the mechanical brake 23, and the turning gearbox 24 comprise a load drive system.

Figure 3:
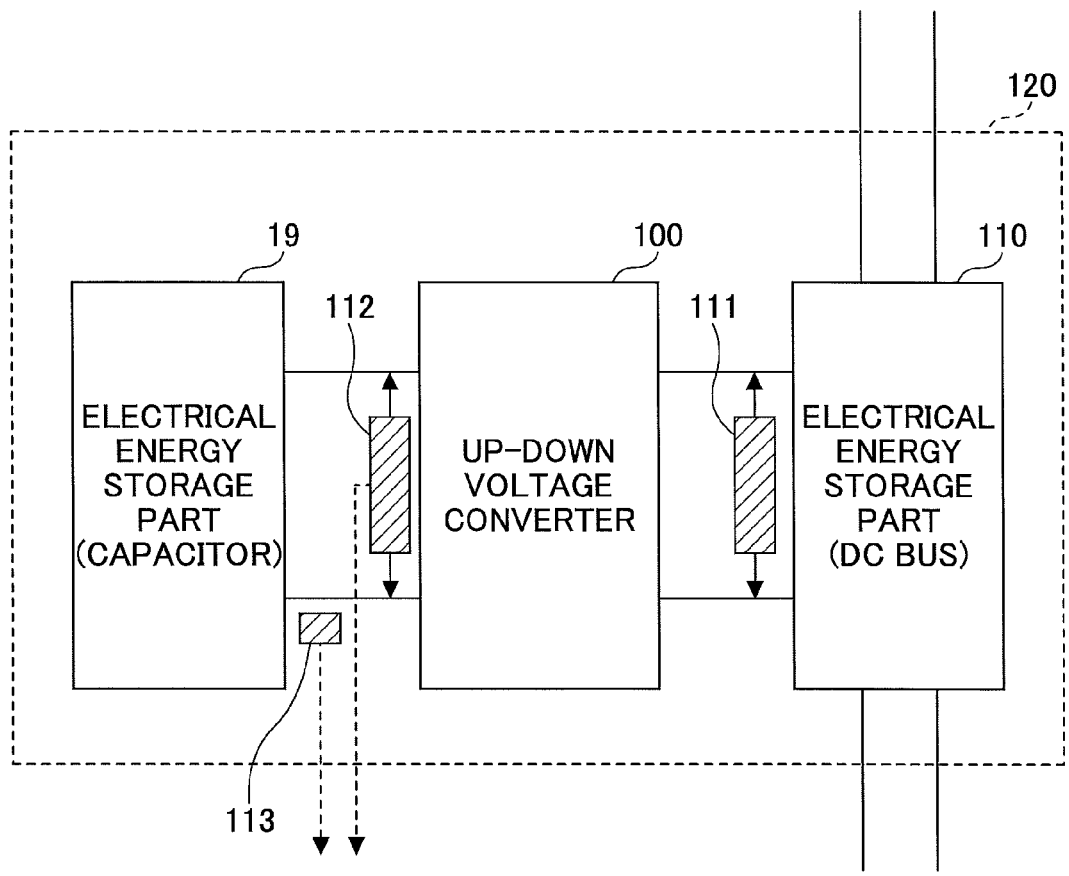
FIG. 3 is a block diagram illustrating a configuration of an electrical energy storage system.

FIG. 3 is a block diagram illustrating a configuration of the electrical energy storage system 120. The electrical energy storage system 120 includes a capacitor 19 as an electrical energy storage device, an up-down voltage converter 100, and a DC bus 110. The DC bus 110 controls transfer of electric power between the capacitor 19, the motor generator 12, and the turning motor 21. A capacitor voltage detection part 112 for detecting a capacitor voltage value and a capacitor current detection part 113 for detecting a capacitor current value are arranged at the capacitor 19. The capacitor voltage value and the capacitor current value detected by the capacitor voltage detection part 112 and the capacitor current detection part 113 are supplied to the controller 30.

The up-down voltage converter 100 corresponds to an electric circuit that controls switching between a voltage raising operation and a voltage lowering operation according to the operating states of the motor generator 12, the generator 300, and the turning motor 21 so that the DC bus voltage value falls within a certain range. The DC bus 110 is arranged between the inverters 18A and 20 and the up-down voltage converter 100, and is configured to transfer electric power between the capacitor 19, the motor generator 12, the generator 300, and the turning motor 21.

Referring back to FIG. 2, the controller 30 corresponds to a control unit that acts as a main control part performing drive control of the hybrid excavator. The controller 30 comprises a processor unit that includes a CPU (central processing unit) and an internal memory. The functions of the controller 30 are implemented by the CPU executing a drive control program stored in the internal memory.

The controller 30 converts a signal received from the voltage sensor 29 into a speed command, and performs drive control of the turning motor 21 using the speed command. The signal received from the voltage sensor 29 is equivalent to the signal indicating the operational amount when the operation device 26 is operated to turn the turning mechanism 2.

The controller 30 controls operation of the motor generator 12 (switching of a motor-assisted operation and a power generating operation), and controls operation of the up-down voltage converter 100 as the voltage raising/lowering control unit to control charging/discharging of the capacitor 19. The controller 30 controls switching of the voltage raising operation and the voltage lowering operation of the up-down voltage converter 100 based on the charge state of the capacitor 19, the operating state of the motor generator 12 (motor-assisted operation or power generating operation) and the operating state (power operation or regeneration operation) of the turning motor 21, so that the charging/discharging of the capacitor 19 is controlled.

The switching control between the voltage raising operation and the voltage lowering operation of the up-down voltage converter 100 is carried out based on the DC bus voltage value detected by the DC bus voltage detection part 111, the capacitor voltage value detected by the capacitor voltage detection part 112, and the capacitor current value detected by the capacitor current detection part 113.

In the above-described configuration, the power generated by the motor generator 12 corresponding to an assist motor is supplied to the DC bus 110 of the electrical energy storage system 120 via the inverter 18A, and supplied to the capacitor 19 via the up-down voltage converter 100. The regeneration power obtained by the regeneration operation of the turning motor 21 is supplied to the DC bus 110 of the electrical energy storage system 120 via the inverter 20, and supplied to the capacitor 19 via the up-down voltage converter 100.

Figure 4:
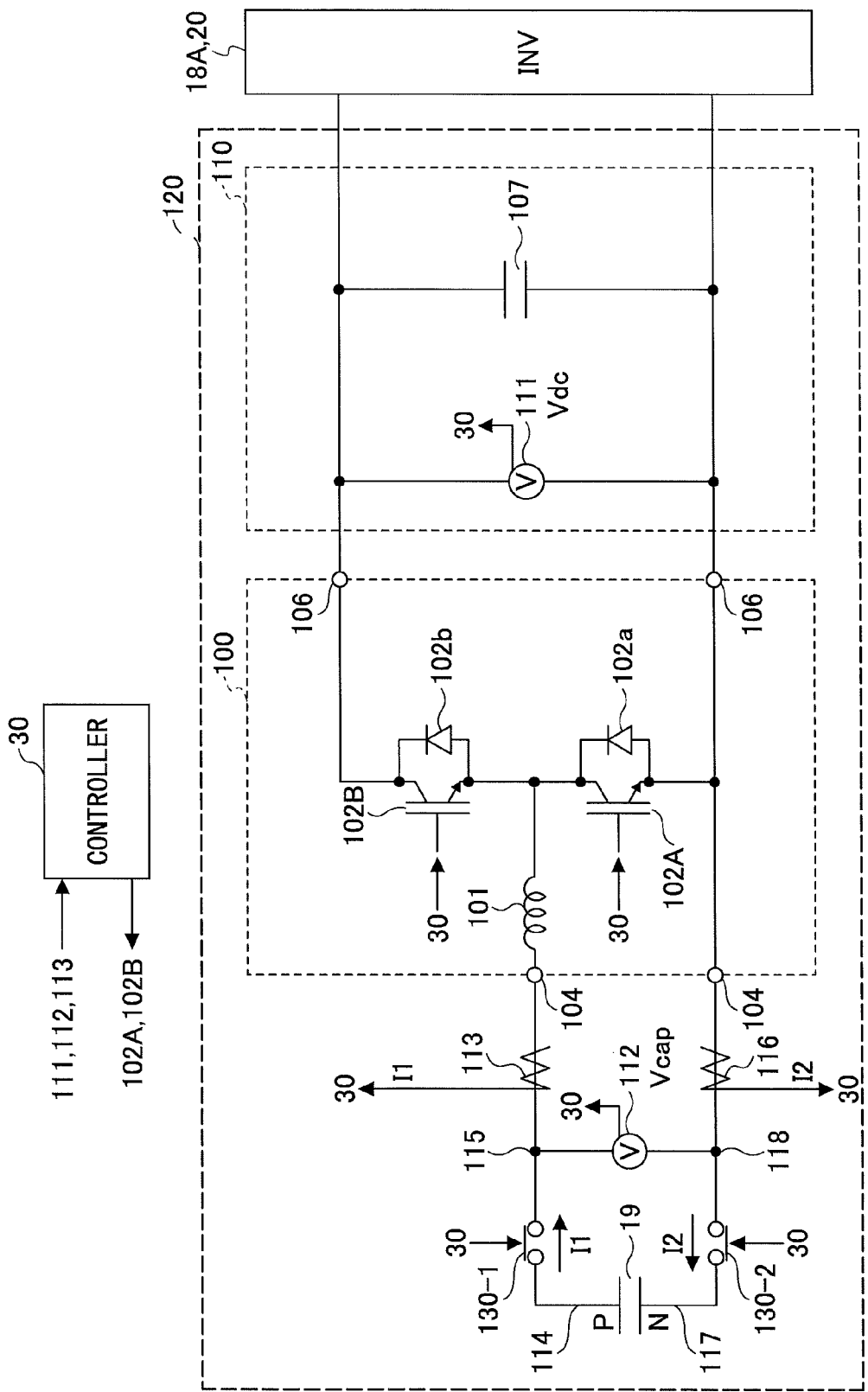
FIG. 4 is a circuit diagram of the electrical energy storage system.

FIG. 4 is a circuit diagram of the electrical energy storage system 120. The up-down voltage converter 100 includes a reactor 101, a voltage raising IGBT (insulated gate bipolar transistor) 102A, a voltage lowering IGBT 102B, a pair of power supply connection terminals 104 for connecting the capacitor 19, a pair of output terminals 106 for connecting the DC bus 110, and a smoothing capacitor 107 connected in parallel to the output terminals 106. The DC bus 110 is connected between the output terminals 106 of the up-down voltage converter 100 and the inverters 18A and 20.

One end of the reactor 101 is connected to the midpoint of the voltage raising IGBT 102A and the voltage lowering IGBT 102B, and the other end of the reactor 101 is connected to one of the power supply connection terminals 104. The reactor 101 is arranged to supply an induced electromotive force that is generated upon switching ON/OFF the voltage raising IGBT 102A to the DC bus 110.

Each of the voltage raising IGBT 102A and the voltage lowering IGBT 102B is formed by a bipolar transistor in which a MOSFET (metal oxide semiconductor field effect transistor) is incorporated in the gate portion. Each of the voltage raising IGBT 102A and the voltage lowering IGBT 102B is a semiconductor element (switching element) that is capable of switching large electric power at high speed. Each of the voltage raising IGBT 102A and the voltage lowering IGBT 102B is driven by the controller 30 supplying a PWM voltage to the gate terminal. A diode 102a and a diode 102b, which are rectifier elements, are connected in parallel to the voltage raising IGBT 102A and the voltage lowering IGBT 102B respectively.

The capacitor 19 may be a chargeable and dischargeable capacitor that enables transfer of electric power between the capacitor 19 and the DC bus 110 via the up-down voltage converter 100. It is noted that although the capacitor 19 is illustrated as an example of the first electrical energy storage part in FIG. 4, a chargeable and dischargeable secondary battery, such as a lithium ion battery, a lithium ion capacitor, or some other form of power supply that can deliver and receive electric power may be used instead of the capacitor 19.

The power supply connection terminals 104 and the output terminals 106 are terminals to which the capacitor 19 and the DC bus 110 are connected. The capacitor voltage detection part 112 for detecting the capacitor voltage value is connected between the power supply connection terminals 104. The DC bus voltage detection part 111 for detecting the DC bus voltage value is connected between the output terminals 106.

The capacitor voltage detection part 112 detects a voltage value Vcap of the capacitor 19. The DC bus voltage detection part 111 detects a voltage value Vdc of the DC bus 110. The smoothing capacitor 107 is an electrical energy storage element that is inserted between the positive-electrode terminal and the negative-electrode terminal of the output terminals 106 and is configured to smooth the DC bus voltage. The voltage of the DC bus 110 is maintained at a predetermined voltage by the smoothing capacitor 107.

The capacitor current detection part 113 is a detection part for detecting the value of the current that flows through the capacitor 19 at a positive-electrode terminal (P terminal) side of the capacitor 19. The capacitor current detection part 113 includes a resistor for current detection. The capacitor current detection part 113 detects a current value I1 of the current flowing through the positive terminal of the capacitor 19. On the other hand, a capacitor current detection part 116 is a detection part for detecting the value of the current that flows through the capacitor 19 at a negative-electrode terminal (N terminal) side of the capacitor 19. The capacitor current detection part 116 includes a resistor for current detection. The capacitor current detection part 116 detects a current value I2 of the current flowing through the negative terminal of the capacitor 19.

When raising the voltage of the DC bus 110 by the up-down voltage converter 100, the PWM voltage is supplied to the gate terminal of the voltage raising IGBT 102A, and the induced electromotive force generated at the reactor 101 in response to switching ON/OFF the voltage raising IGBT 102A is supplied to the DC bus 110 through the diode 102b connected in parallel to the voltage lowering IGBT 102B. Thereby, the voltage of the DC bus 110 is increased.

When lowering the voltage of the DC bus 110 by the up-down voltage converter 100, the PWM voltage is supplied to the gate terminal of the voltage lowering IGBT 102B, and the regeneration power supplied via the voltage lowering IGBT 102B and the inverters 18A and 20 is supplied from the DC bus 110 to the capacitor 19. In this way, the capacitor 19 is charged by the power stored in the DC bus 110 and the voltage of the DC bus 110 is lowered.

In the present embodiment, a power supply line 114 connects the positive-electrode terminal of the capacitor 19 to the power supply connection terminal 104, and a relay 130-1 that acts as a breaker for interrupting the power supply line 114 is arranged at the power supply line 114. The relay 130-1 is arranged between a connection point 115 of the capacitor voltage detecting part 112 to the power supply line 114 and the positive-electrode terminal of the capacitor 19. The relay 130-1 is operated by a signal from the controller 30 and is capable of cutting off the capacitor 19 from the up-down voltage converter 100 by interrupting connection of the power supply line 114 to the capacitor 19.

Also, a power supply line 117 connects the negative-electrode terminal of the capacitor 19 to the power supply connection terminal 104, and a relay 130-2 that acts as a breaker for interrupting the power supply line 117 is arranged at the power supply line 117. The relay 130-2 is arranged between a connection point 118 of the capacitor voltage detecting part 112 to the power supply line 117 and the negative-electrode terminal of the capacitor 19. The relay 130-2 is operated by a signal from the controller 30 and is capable of cutting off the capacitor 19 from the up-down voltage converter 100 by interrupting connection of the power supply line 117 to the capacitor 19. It is noted that in an alternative embodiment, the relays 130-1 and 130-2 may be a single relay that simultaneously interrupts both the positive-electrode terminal side power supply line 114 and the negative-electrode terminal side power supply line 117 to cut off the capacitor 19 from the up-down voltage converter 100.

Also, it is noted that in practical applications, a drive part that generates a PWM signal for driving the voltage raising IGBT 102A and the voltage lowering IGBT 102B is arranged between the controller 30 and each of the voltage raising IGBT 102A and the voltage lowering IGBT 102B. However, the illustration of the drive part is omitted in FIG. 4. Such a drive part may be implemented by either an electronic circuit or a processor unit.

In the present embodiment, energy may be efficiently used in driving an electrical load with the electric power from the electrical energy storage device of the hybrid excavator with the above-described configuration by maintaining the charge rate SOC of the capacitor 19 at a desirably high level at all times.

In present embodiment, the controller 30 of the hybrid excavator with the above-described configuration includes an abnormality detection part for detecting an abnormality of the electrical energy storage unit caused by a fault in the electrical energy storage unit or degradation of the electrical energy storage device, for example. By taking appropriate measures in response to the abnormality detected by the abnormality detection part, safe and stable operations of the excavator may be enabled, for example.

Figure 5:
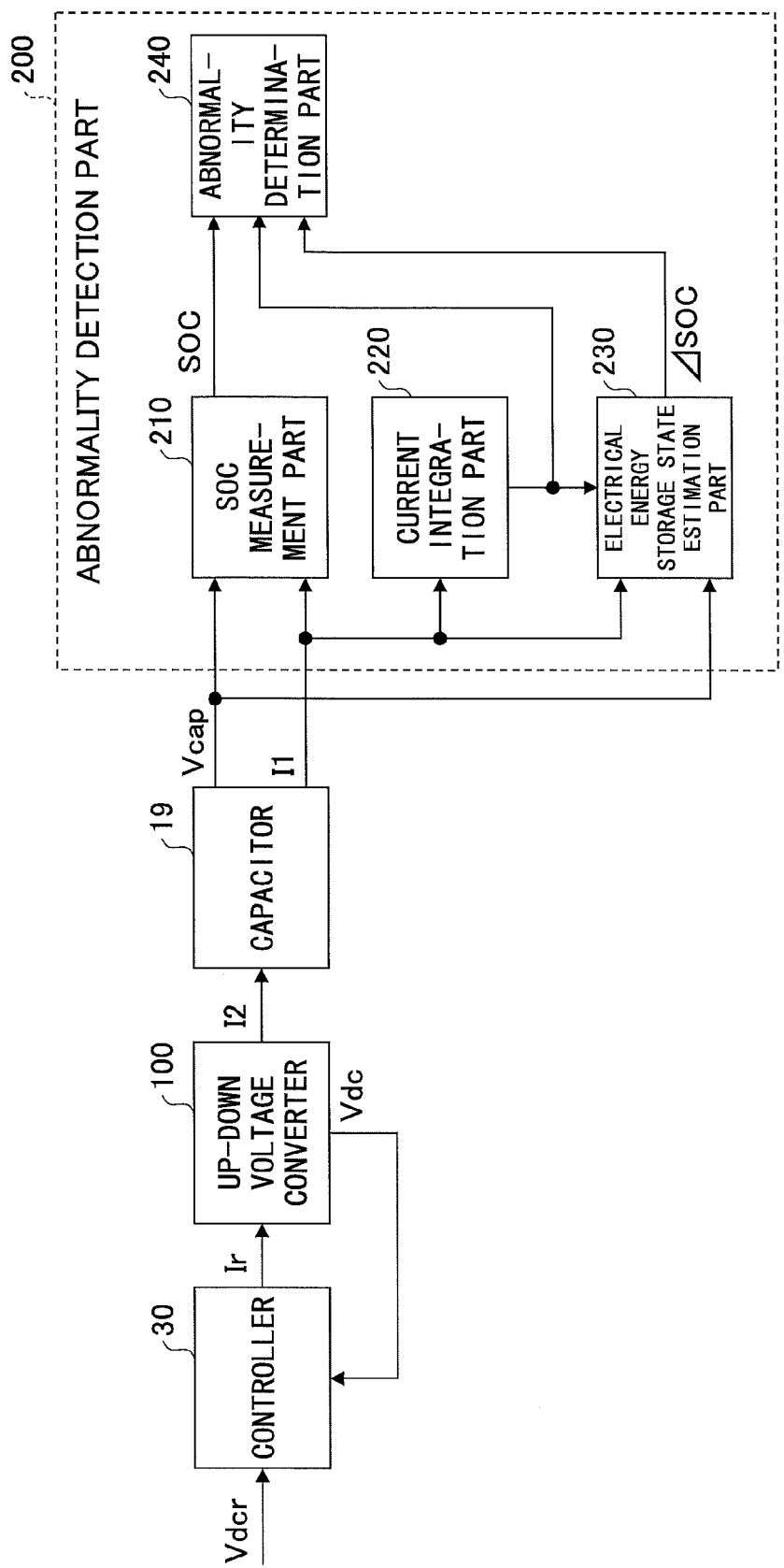
FIG. 5 is a block diagram illustrating functions of an abnormality detection part according to an embodiment of the present invention.

FIG. 5 is a block diagram illustrating functions of an abnormality detection part 200 of the present embodiment. The abnormality detection part 200 includes a SOC measurement part 210, a current integration part 220, an electrical energy storage state estimation part 230, and an abnormality determination part 240. The abnormality detection part 200 may be implemented by a control circuit comprising a microcomputer, for example. It is noted that in the example illustrated in FIG. 5, the abnormality detection part 200 is illustrated as a separate element from the controller 30 of the excavator. However, the abnormality detection part 200 may alternatively be included in the controller 30.

In the present embodiment, a DC bus voltage target value Vdcr is supplied to the controller 30. The controller 30 obtains the DC bus voltage target value Vdcr, a voltage value output from the up-down voltage converter 100 (i.e., DC bus voltage Vdc detected by the voltage detection part 113), and a charge current target value Ir of the charge current to be flown through the capacitor 19, and supplies the obtained values to the up-down voltage converter 100. The up-down voltage converter 100 supplies a charge current I2 to the capacitor 19 based on the charge current target value Ir. In this way, the capacitor 19 is charged and the charge rate SOC is maintained between a system control upper limit value and a system control lower limit value.

The abnormality detection part 200 of the present embodiment is configured to determine whether an abnormality has occurred at the electrical energy storage system 120 corresponding to an electrical energy storage unit including the capacitor 19 as an electrical energy storage device by obtaining an estimation value of an electrical energy storage state of the capacitor 19 based on an amount of change $\Delta SOC$ in the charge rate SOC of the capacitor 19 over a certain time interval.

The SOC measurement part 210 of the abnormality detection part 200 measures the charge rate SOC of the capacitor 19 based on the capacitor voltage value Vcap detected by the capacitor voltage detection part 112 and the current value I1 detected by the capacitor current detection part 116. The SOC measurement part 210 outputs the measured charge rate SOC to the abnormality determination part 240. The current integration part 220 integrates the current value I1 detected by the capacitor current detection part 116 and outputs the integrated value to the electrical energy storage state estimation part 230. The integrated value is also supplied to the abnormality determination part 240.

The electrical energy storage state estimation part 230 computes the amount of change $\Delta SOC$ in the charge rate SOC of the capacitor 19 based on the capacitor voltage value Vcap detected by the capacitor voltage detection part 112, the current value I1 detected by the capacitor current detection part 116, and the integrated value supplied from the current integration part 220. It is noted that the amount of change $\Delta SOC$ in the charge rate SOC computed in this manner is not the actual amount of change in the charge rate SOC based on actual measurement values of the charge rate SOC but rather an estimation value of the amount of change in the charge rate SOC that is estimated based on the capacitor voltage value Vcap, the current value I1, and the integrated value of the current value I1. The electrical energy storage state estimation part 230 outputs the amount of change $\Delta SOC$ obtained through computation in the charge rate SOC to the abnormality determination part 240.

The abnormality determination part 240 determines whether an abnormality has occurred at the electrical energy storage system 120 (electrical energy storage unit) including the capacitor 19 based on the charge rate SOC supplied from the SOC measurement part 210 and the amount of change $\Delta SOC$ in the charge rate SOC supplied from the electrical energy storage state estimation part 230. Upon determining that an abnormality has occurred at the electrical energy storage system 120 (electrical energy storage unit) including the capacitor 19, the abnormality determination part 240 performs corresponding processes to respond to the abnormality.

Figure 6:
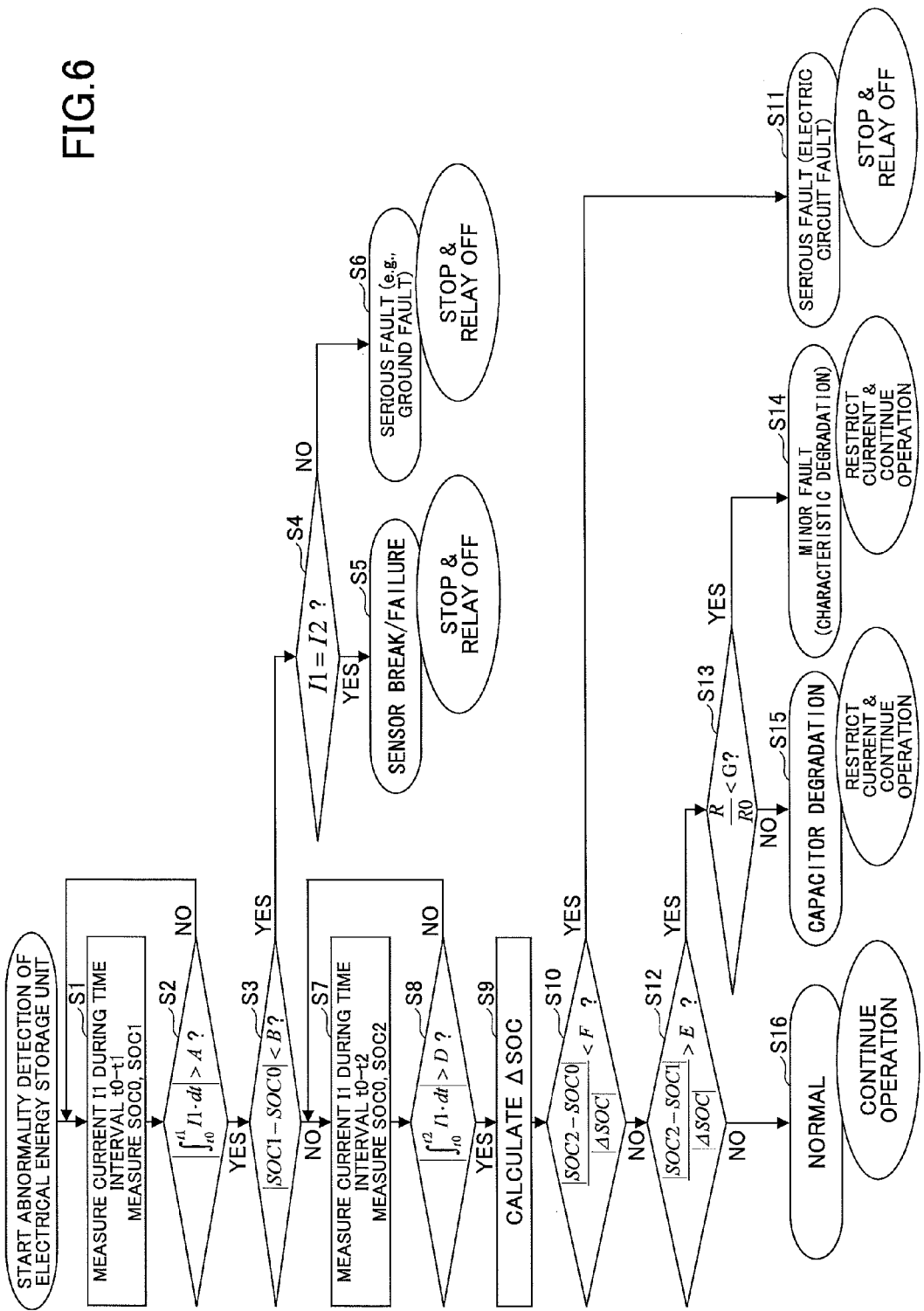
FIG. 6 is a flowchart illustrating process steps of an abnormality determination process for determining an abnormality of an electrical energy storage unit.
Figure 7:
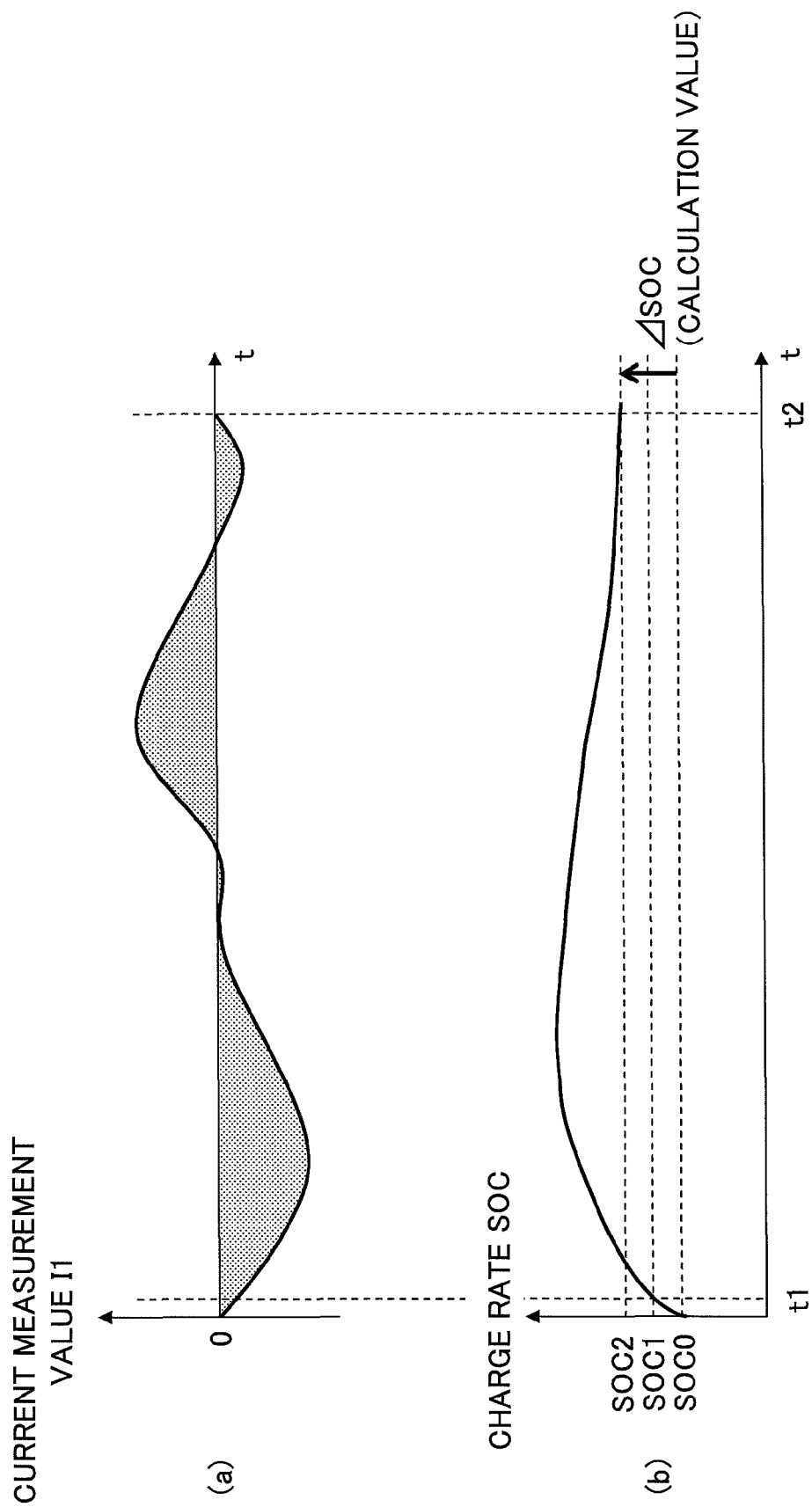
FIG. 7 is a graph illustrating temporal changes in the current value of the current flowing through a capacitor and the charge rate of the capacitor during the abnormality determination process.

In the following, an abnormality determination process for determining an abnormality of the electrical energy storage unit is described with reference to FIGS. 6 and 7. FIG. 6 is a flowchart illustrating process steps of the abnormality determination process. FIG. 7 is a graph illustrating temporal changes in the current value I1 and the charge rate SOC of the capacitor 19 while the abnormality determination process is performed.

When the abnormality determination process is started, first, in step S1, the current value I1 over a first fixed time interval T1 is measured by the capacitor current detection part 113. It is noted that the first fixed time interval T1 is a relatively short time period (e.g., 0.5 seconds) from time t0 to time t1. In step S1, a charge rate SOC0 of the capacitor 19 at time t0 and a charge rate SOC1 of the capacitor 19 at time t1 are measured by the SOC measurement part 210.

Then, in step S2, the current integration part 220 computes an integrated value by integrating the current value I1 from time t0 to time t1 (i.e., first fixed time interval T1) and determines whether an absolute value of the integrated value is greater than a predetermined value A. By integrating the current value I1, the current integration part 220 obtains the amount of current from time t0 to time t1. By comparing the integrated value of the current value I1 with the predetermined value A, the current integration part 220 determines whether a current has flown through the capacitor 19. Because the time period from time t0 to time t1 (first fixed time interval T1) for detecting the current value I1 is relatively short, noise may be included in the measurement value of the current value I1. Accordingly, the predetermined value A is used to remove influences from noise. The predetermined value A is set equal to a value representing a certain amount of current that would enable a determination that a current has in fact flown through the capacitor within the above short time span. That is, in a case where the absolute value of the integrated value of the current value I1 is less than or equal to the predetermined value A, the current integration part 220 determines that the measurement value of the current value I1 could possibly be attributed to noise and does not determine that a current has flown though the capacitor 19. On the other hand, in a case where the absolute value of the integrated value of the current value I1 is greater than the predetermined value A, the current integration part 220 determines that the measurement value of the current value I1 is greater than that which can be attributed to noise and therefore determines that a current has in fact flown through the capacitor 19. It is noted that the absolute value of the integrated value of the current value I1 is used above because if the current value I1 of the current flowing through the capacitor 19 during discharge of the capacitor 19 is represented by a positive value, the current value I1 of the current flowing through the capacitor 19 during charge of the capacitor 19 would be represented by a negative value. That is, by using the absolute value of the integrated value of the current value I1 in step S2, a determination may be made as to whether a current has flown through the capacitor 19 in both a case where the capacitor 19 is charged and a case where the capacitor 19 is discharged.

In the case where it is determined in step S2 that the absolute value of the integrated value of the current value I1 integrated from time t0 to time t1 is not greater than the predetermined value A (i.e., less than or equal to the predetermined value A), that is, if it is determined that a current has not flown through the capacitor 19, the process goes back to step S1, and the current value I1, the charge rates SOC0 and SOC1 are measured once again. On the other hand, in the case where it is determined in step S2 that the absolute value of the integrated value of the current value I1 is greater than the predetermined value A, that is, if it is determined that a current has flown through the capacitor 19, the process proceeds to step S3.

In step S3, the abnormality determination part 240 determines whether an absolute value of a value obtained by subtracting the charge rate SOC0 at time t0 from the charge rate SOC1 at time t1 is less than a predetermined value B. That is, the abnormality determination part 240 determines whether the amount of change in the charge rate SOC from time t0 to time t1 (first fixed time interval T1) is less than the predetermined value B. The predetermined value B corresponds to the amount of increase in the charge rate (if the capacitor 19 is charged) or the amount of decrease in the charge rate (if the capacitor is discharged) in the case where a current equal to the predetermined value A is flown through the capacitor 19. The predetermined value B is set equal to a suitable value for adequately removing influence from noise. Thus, in a case where the absolute value of the value obtained by subtracting the charge rate SOC0 at time t0 from the charge rate SOC1 at time t1 is less than the predetermined value B, that is, when the amount of change in the charge rate is very small with respect to the amount of current that has flown through the capacitor 19, the abnormality determination part 240 determines that an abnormality has occurred at the electrical energy storage unit or the capacitor 19. On the other hand, in a case where the absolute value of the value obtained by subtracting the charge rate SOC0 at time t0 from the charge rate SOC1 at time t1 is greater than or equal to the predetermined value B, that is, when the amount of change in the charge rate is greater than that which would simply be attributed to noise with respect to the amount of current that has flown through the capacitor 19, the abnormality determination part 240 determines that no abnormality has occurred at the electrical energy storage unit or the capacitor 19. It is noted that when the predetermined value B, which is used as a reference value for detecting an abnormality, is set equal to zero, abnormality may not be detected even when there is in fact an abnormality. That is, the subtraction value may not equal zero due to the influence of noise. Thus, the predetermined value B is set equal to a suitable value taking into account the influence of noise.

In the case where it is determined in step S3 that the absolute value of the value obtained by subtracting the charge rate SOC0 at time t0 from the charge rate SOC1 at time t1 is less than the predetermined value B, that is, when the amount of change in the charge rate is very small with respect to the amount of current that has flown through the capacitor 19, the abnormality determination part 240 determines that an abnormality has occurred, and the process proceeds to step S4. In step S4, the abnormality determination part 240 determines whether the current value I1 of the current flowing at the positive-electrode side of the capacitor 19 is equal to the current value I2 of the current flowing at the negative-electrode side of the capacitor 19 in order to determine the type of the abnormality.

In the case where the current value I1 is equal to the current value I2, the abnormality determination part 240 can determine that a current is not leaking outside and that the capacitor 19 itself is normal. If the capacitor 19 is normal, the abnormality determination part 240 can determine that the detected abnormality corresponds to an abnormality of a component or wiring of the electrical energy storage unit (e.g., sensor break/failure). Thus, if it is determined in step S4 that the current value I1 is equal to the current value I2, the process proceeds to step S5 where the abnormality determination part 240 stops operation of the electrical energy storage unit and cuts off the normal capacitor 19 from the electrical energy storage unit based on the determination that the detected abnormality can be attributed to a fault of a component or wiring of the electrical energy storage unit. The capacitor 19 may be cut off from the electrical energy storage unit by turning OFF the relays 130-1 and 130-2 and interrupting the power supply lines 114 and 117. On the other hand, if it is determined in step S4 that the current value I1 is not equal to the current value I2, the process proceeds to step S6 where the abnormality determination part 240 determines that a serious fault such as ground fault has occurred at the capacitor 19. Based on such determination, the abnormality determination part 240 stops operation of the electrical energy storage unit and cuts off the capacitor 19 from the electrical energy storage unit. The capacitor 19 may be cut off from the electrical energy storage unit by turning OFF the relays 130-1 and 130-2 and interrupting the power supply lines 114 and 117.

In the case where it is determined in step S3 that the absolute value of the value obtained by subtracting the charge rate SOC0 at time t0 from the charge rate SOC1 at time t1 is greater than or equal to the predetermined value B, that is, when the amount of change in the charge rate is greater than that which can simply be attributed to noise with respect to the amount of current that has flown through the capacitor 19, the process proceeds to step S7. In step S7, the current value I1 over a second fixed time interval T2 is measured by the capacitor current detection part 113. The second fixed time interval T2 from time t0 to time t2 is longer than the first fixed time interval T1 (e.g., 1 minute). Also, in step S2, the SOC measurement part 210 measures a charge rate SOC2 of the capacitor 19 at time t2.

It is noted that a predetermined amount of charge is necessary for specifying the type of abnormality of the electrical energy storage unit in steps S10-14. Thus, a determination has to be made as to whether a sufficient amount of current has flown through the capacitor 19 over a relatively long time span from time t0 to time t2. Accordingly, in step S8, the current integration part 220 obtains an integrated value from integrating the current value I1 from time t0 to time t2 (i.e., second fixed time interval T2). The current integration part 220 then determines whether an absolute value of the integrated value is greater than a predetermined value D. By integrating the current value I1 from time t0 to time t2, the current integration part 220 obtains the amount of current that has flown through the capacitor 19 over the relatively long time span from time t0 to time t2 and determines whether the amount of current is greater than the predetermined value D. It is noted that step S8 corresponds to a process step for determining whether a certain amount of current has flown through the capacitor 19 that would change the charge rate SOC of the capacitor 19 by at least a predetermined amount. Thus, the predetermined value D corresponds to the amount of current necessary for obtaining a predetermined amount of charge in steps S10-S14.

In step S8, if the absolute value of the integrated value of the current value I1 is less than or equal to the predetermined value D, the process goes back to step S7 and steps S7 and S8 are repeated. On the other hand, if the absolute value of the integrated value of the current value I1 is greater than the predetermined value D, the process proceeds to step S9. It is noted that the absolute value of the integrated value of the current value I1 is used above because if the current value I1 of the current flowing through the capacitor 19 during discharge of the capacitor 19 is represented by a positive value, the current value I1 of the current flowing through the capacitor 19 during charge of the capacitor 19 would be represented by a negative value. Thus, in step S8, the charge current (positive value) and the discharge current (negative value) are combined, and in a case where the charge current is greater than the discharge current, the integrated value would be a negative value so that the absolute value of this negative value is obtained and compared with the predetermined value D, which is a positive value.

In step S9, the electrical energy storage state estimation part 230 calculates (computes) an amount of change ΔSOC in the charge rate SOC of the capacitor 19 from time t0 to time t2. That is, the amount of change ΔSOC calculated in step S9 corresponds to the difference between a charge rate SOC2 at time t2 and the charge rate SOC0 at time t0. The amount of change ΔSOC of the charge rate SOC may be calculated using the following Formula 1:

$$\Delta SOC = \frac{\left(VT\sqrt{SOC0} - \frac{1}{C}\int_{t0}^{t2} I1 \cdot dt\right)^2}{VT^2} - SOC0 \quad \text{[Formula 1]}$$

Next, in step S10, the abnormality determination part 240 determines whether a value obtained by dividing the absolute value of SOC2-SOC0 by the absolute value of ΔSOC (|SOC2-SOC0|/|ΔSOC|) is less than a first threshold value F. The first threshold value F may be set equal to 0.9 (90% with respect to ΔSOC), for example. The first threshold value may be set equal to a suitable value empirically taking into account variations that can be tolerated between the values SOC2-SOC0 and ΔSOC. When the amount of change in the charge rate is less than the first threshold value F, this means that the amount of change in the charge rate |SOC2-SOC0| obtained through measurement is smaller than the amount of change in the charge rate |ΔSOC| obtained through computation. Because such a situation does not normally occur, when the value obtained by dividing the absolute value of SOC2-SOC0 by the absolute value of ΔSOC (|SOC2-SOC0|/|ΔSOC|) is less than a first threshold value F, the abnormality determination part 240 determines that some type of fault in the electric circuit of the electrical energy storage unit (serious fault) has occurred and that an abnormality could possibly occur at the capacitor 19 if the electrical energy storage unit continues to be operated. Thus, the process proceeds to step S11 where the abnormality detection part 200 stops operation of the electrical energy storage unit and cuts off the capacitor 19 from the electric circuit of the electrical energy storage unit. At the same time, the abnormality detection part 200 may alert (notify) an operator of the excavator that a serious fault has occurred at the electrical energy storage unit by sounding an alarm or displaying a warning at a display panel of the cabin, for example.

On the other hand, if it is determined in step S10 that the value obtained by dividing the absolute value of SOC2-SOC0 by the absolute value of ΔSOC (|SOC2-SOC0|/|ΔSOC|) is not less than the first threshold value F, the process proceeds to step S12. In step S12, the abnormality determination part 240 determines whether the value obtained by dividing the absolute value of SOC2-SOC0 by the absolute value of ΔSOC (|SOC2-SOC0|/|ΔSOC|) is greater than a second threshold value E. The second threshold value E is a reference value used for determining the degree of degradation of the capacitor 19 and may be set equal to 1.25 (125% with respect to ΔSOC), for example. The second threshold value E may be set equal to a suitable value based on empirical information, for example. When the value obtained by dividing the absolute value of SOC2-SOC0 by the absolute value of ΔSOC (|SOC2-SOC0|/|ΔSOC|) is greater than the second threshold value E, the abnormality determination part 240 may determine that degradation of the capacitor 19 is progressing. Thus, if it is determined in step S12 that the value obtained by dividing the absolute value of SOC2-SOC0 by the absolute value of ΔSOC (|SOC2-SOC0|/|ΔSOC|) is greater than the second threshold value E, the process proceeds to step S13.

In step S13, the abnormality determination part 240 determines whether a value obtained by dividing a present value R of the internal resistance of the capacitor 19 by an initial value R0 (R/R0) is less than a third threshold value G. It is noted that the internal resistance of the capacitor 19 becomes greater as degradation of the capacitor 19 progresses. Thus, the third threshold value G also corresponds to a reference value used for determining the degree of degradation of the capacitor 19.

The third threshold value G may be set equal to 1.50 (150%), for example. When it is determined in step S13 that the value obtained by dividing the present value R of the internal resistance of the capacitor 19 by the initial value R0 (R/R0) is less than the third threshold value G, the abnormality determination part 240 determines that characteristic degradation of the capacitor 19 is occurring (minor fault). Accordingly, the process proceeds to step S14 where the discharge current flowing from the capacitor 19 and the charge current flowing to the capacitor 19 are restricted so as to reduce the burden on the capacitor 19 and the operation of the electrical energy storage unit is continued. At the same time, the abnormality detection part 200 may alert (notify) the operator of the excavator that a minor fault has occurred at the electrical energy storage unit by sounding an alarm or displaying a warning at a display panel of the cabin, for example. It is noted that characteristic degradation of the capacitor 19 may include short circuit of a part of a cell of the capacitor 19, or a fault of an equalization circuit, for example. On the other hand, when it is determined in step S13 that the value obtained by dividing the present value R of the internal resistance of the capacitor 19 by the initial value R0 (R/R0) is not less than the third threshold value G, the abnormality determination part 240 determines that the detected abnormality is due to degradation of the capacitor 19. Accordingly, the process proceeds to step S15 where the discharge current flowing from the capacitor 19 and the charge current flowing to the capacitor 19 are restricted so as to reduce the burden on the capacitor 19 and the operation of the electrical energy storage unit is continued. It is noted that the present value R of the internal resistance of the capacitor 19 may be an internal resistance value measured when a key of the excavator is turned on, or the internal resistance value measured during idling of the engine, for example. Alternatively, the latest internal resistance value measured during the above-described abnormality determination process may be used as the present value R. The measurement of the internal resistance may be conducted using any measurement method known in the industry.

On the other hand, when it is determined in step S12 that the value obtained by dividing the absolute value of SOC2−SOC0 by the absolute value of $\Delta$SOC (|SOC2−SOC0|/|$\Delta$SOC|) is not greater than the second threshold value E, this means that the charge rate obtained based on an actual measurement value and the charge rate obtained based on the amount of current flowing through the capacitor 19 are substantially the same, and the abnormality determination part 240 may therefore determine that the electrical energy storage unit including the capacitor 19 is operating normally. Thus, the process proceeds to step S16 where operation of the electrical energy storage unit is continued as is.

Figure 8:
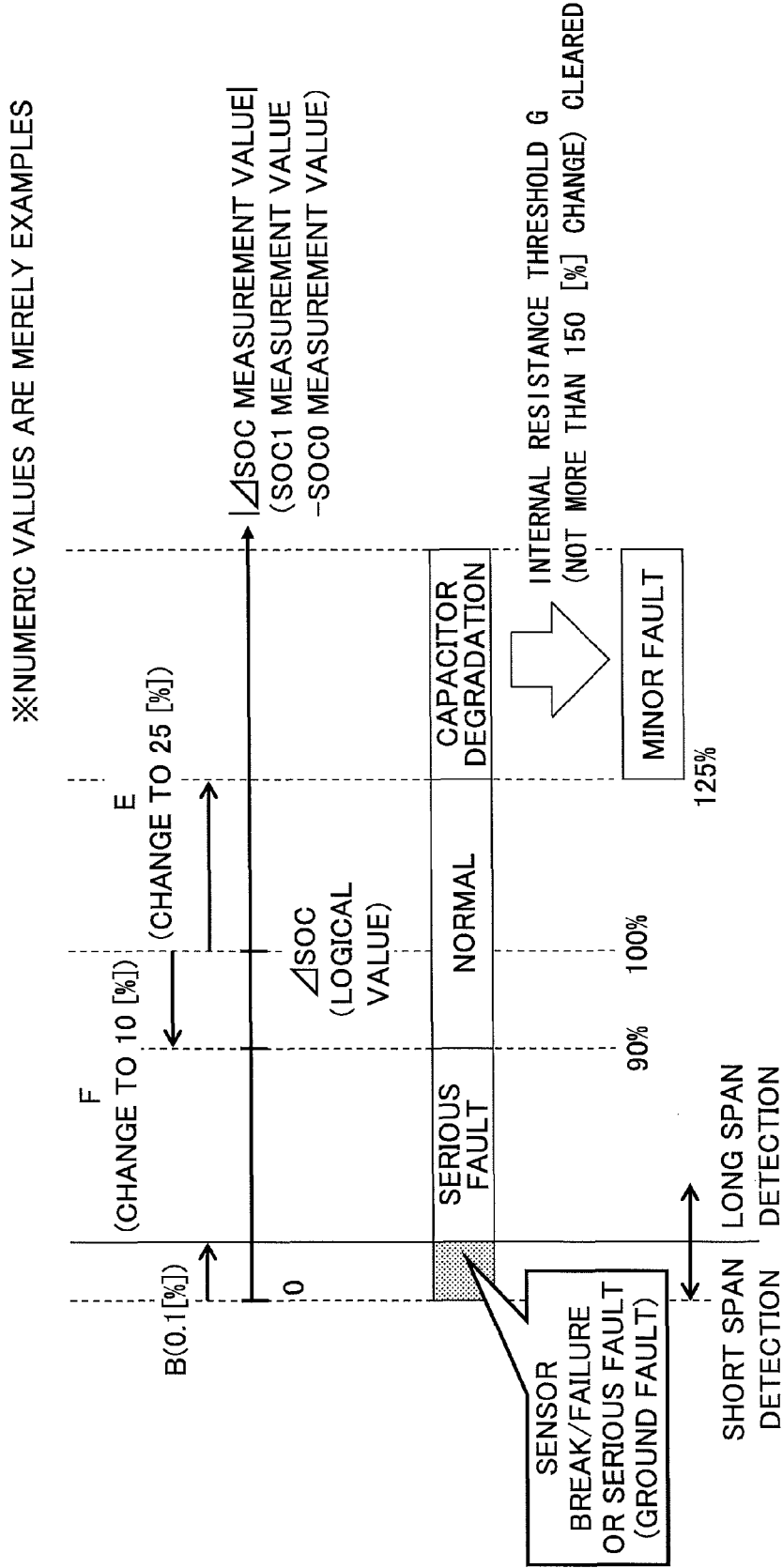
FIG. 8 is a diagram illustrating a method of determining an abnormality as a degradation or fault of the electrical energy storage unit using the amount of change in the charge rate as an index.

FIG. 8 is a graph summarizing the specific determinations made in the above abnormality determination process. In FIG. 8, the horizontal axis represents the amount of change $\Delta$SOC in the charge rate obtained based on a measurement value.

First, in steps S1-S6, which correspond to process steps for abnormality detection with respect to the first fixed time interval T1 (e.g., 0.5 seconds) (short span detection), an abnormality is detected when the amount of change $\Delta$SOC in the charge rate obtained based on measurement is less than the predetermined value B (fourth threshold value) even though a charge current or discharge current has been supplied to charge/discharge the capacitor 19, and the detected abnormality is determined to be a sensor break/failure or a serious fault such as ground fault.

After the short span detection is completed, steps S7-S16 corresponding to process steps for abnormality detection with respect to the second time interval T2 (e.g., 1 minute) (long span detection) are performed. In the long span detection, the amount of change $\Delta$SOC in the charge rate obtained through computation based on the current flowing through the capacitor 19 (logical value) and the amount of change $\Delta$SOC in the charge rate obtained based on an actual measurement value are compared to determine whether an abnormality such an electric circuit fault of the electric energy storage unit or degradation of the capacitor 19 has occurred. Specifically, in a case where the amount of change $\Delta$SOC in the charge rate obtained based on an actual measurement value is less than 90% (assuming the first threshold value F is set equal to 0.9) of the amount of change $\Delta$SOC in the charge rate obtained through computation based on the current flowing through the capacitor 19 (logical value), it is determined that a serious fault has occurred. In a case where the former value is between 90-1250 of the latter value (assuming the second threshold value E is set equal to 1.25), it is determined that operation is normal; and in a case where the former value exceeds 125% of the latter value, it is determined that degradation of the capacitor 19 has occurred.

Further, where the amount of change $\Delta$SOC in the charge rate obtained based on an actual measurement value exceeds 125% of the amount of change $\Delta$SOC in the charge rate obtained through computation based on the current flowing through the capacitor 19 (logical value) and it is determined that degradation of the capacitor 19 has occurred, if the present value R of the internal resistance of the capacitor 19 is less than 150% of the initial value R0 (assuming the third threshold value G is set equal to 1.50), it is determined that the degradation of the capacitor is due to a minor fault of the capacitor 19 (e.g., short circuit of cell, fault of equalization circuit).

It is noted that in the above-described embodiment, the charge rate SOC is used as an index for determining whether a fault or degradation of the electrical energy storage unit has occurred. It is noted that the charge rate $\Delta$SOC of a capacitor is proportional to the square of the capacitor voltage. Thus, in an alternative embodiment, instead of using the charge rate SOC and the amount of change $\Delta$SOC in the charge rate, the voltage of the capacitor 19 and the amount of change in the voltage of the capacitor 19 may be used, for example.

Figure 9:
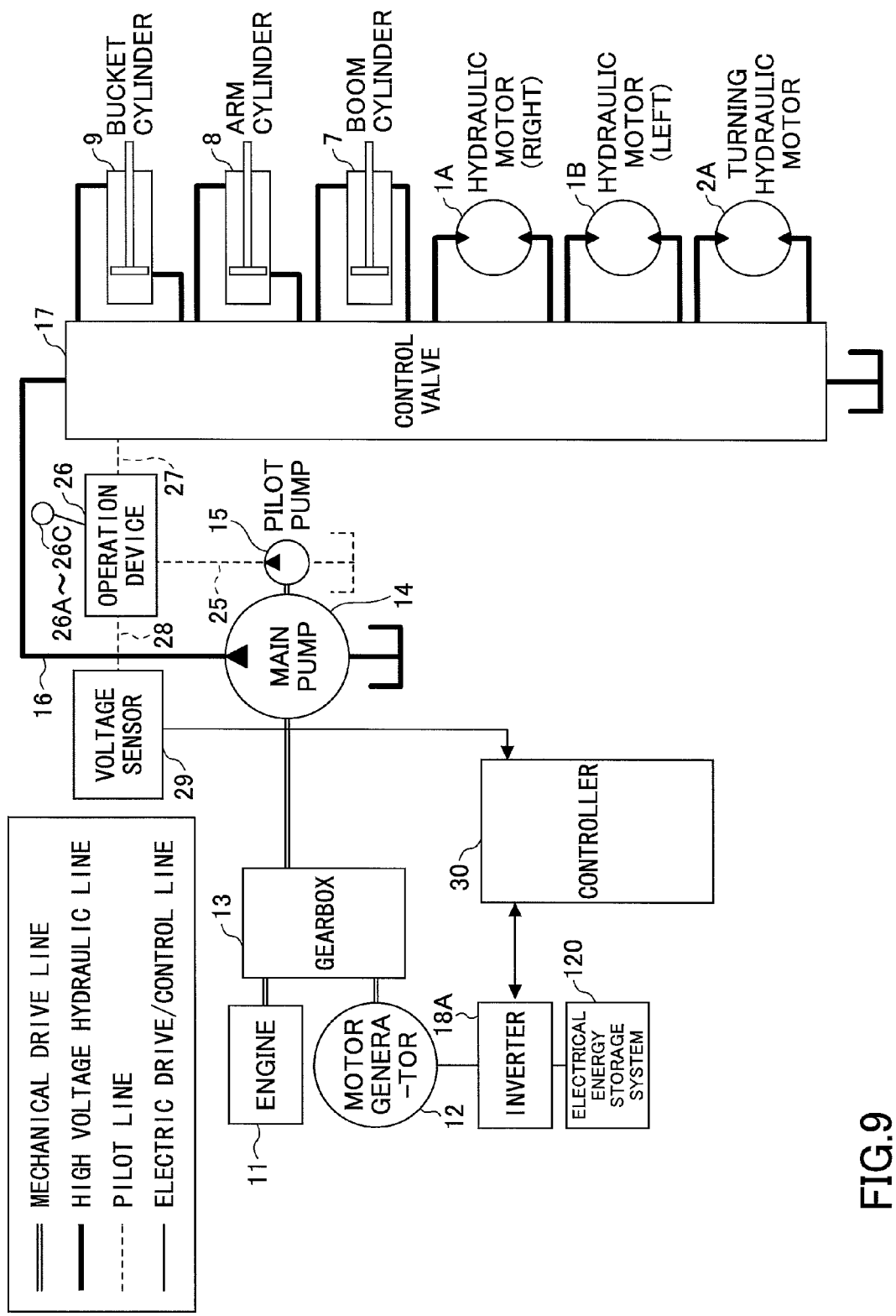
FIG. 9 is a block diagram illustrating a configuration of a drive system of a hybrid excavator in which a turning mechanism is hydraulically driven.

Also, it is noted that although the turning mechanism 2 corresponds to an electric work element, the turning mechanism 2 may alternatively be hydraulically driven rather than being electrically driven. In the case where the turning mechanism 2 of the hybrid excavator illustrated in FIG. 2 is switched to a hydraulically-driven element, the drive system of the excavator may have a configuration as illustrated in FIG. 9, for example. The hybrid hydraulic excavator illustrated in FIG. 9 has a turning hydraulic motor 2A instead of the tuning motor 21 that is connected to the control valve 17, and the turning mechanism 2 is driven by the turning hydraulic motor 2A. It is noted that abnormality determination of the electrical energy storage unit including the capacitor 19 according to the present embodiment may also be implemented in the hybrid hydraulic excavator as described above.

Figure 10:
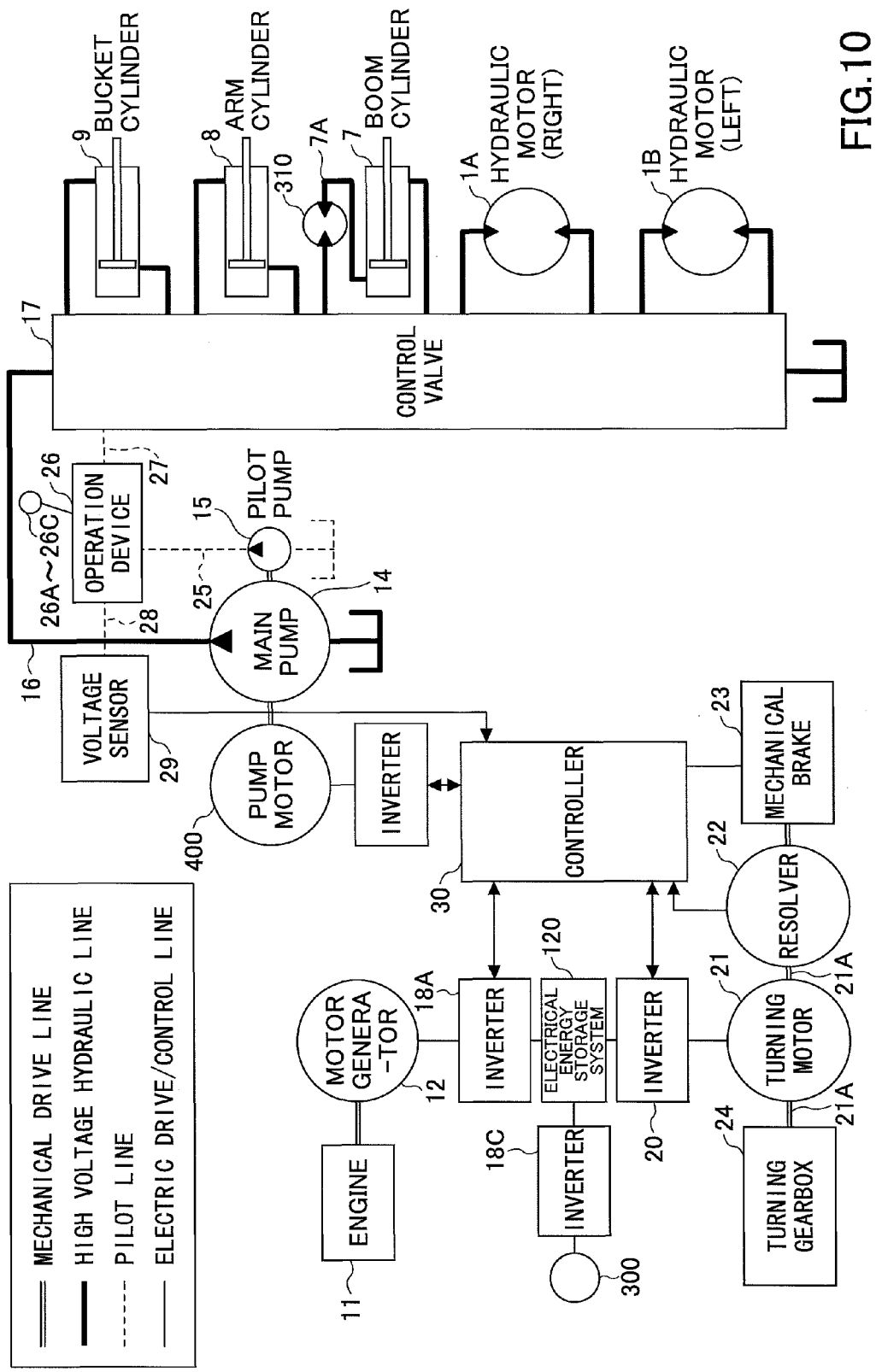
FIG. 10 is a block diagram illustrating a configuration of a drive system of a series hybrid excavator.

Also, it is noted that the present embodiment is implemented in the so-called parallel hybrid excavator that has the engine 11 and the motor generator 12 connected to the main pump 14 (hydraulic pump) to drive the main pump 14. However, the present invention may also be applied to the so-called series hybrid excavator as illustrated in FIG. 10, for example, in which the motor generator 12 is driven by the engine 11, electric power generated by the motor generator 12 is stored in the electrical energy storage system 120, and the main pump 14 is driven solely by the electric power stored in the electrical energy storage system 120. In this case, the motor generator 12 may only have a generator function for generating electric power upon being driven by the engine 11.

In the hybrid excavator as illustrated in FIG. 10, hydraulic power regeneration is performed using hydraulic fluid discharged from the boom cylinder 7. Specifically, a hydraulic motor 310 is arranged in a hydraulic piping 7A for the hydraulic fluid discharged from the boom cylinder 7, and a generator 300 is driven by a boom regeneration hydraulic motor to generate regeneration power. The power generated by the generator 300 is supplied to the electrical energy storage system 120 via the inverter 18C.

Figure 11:
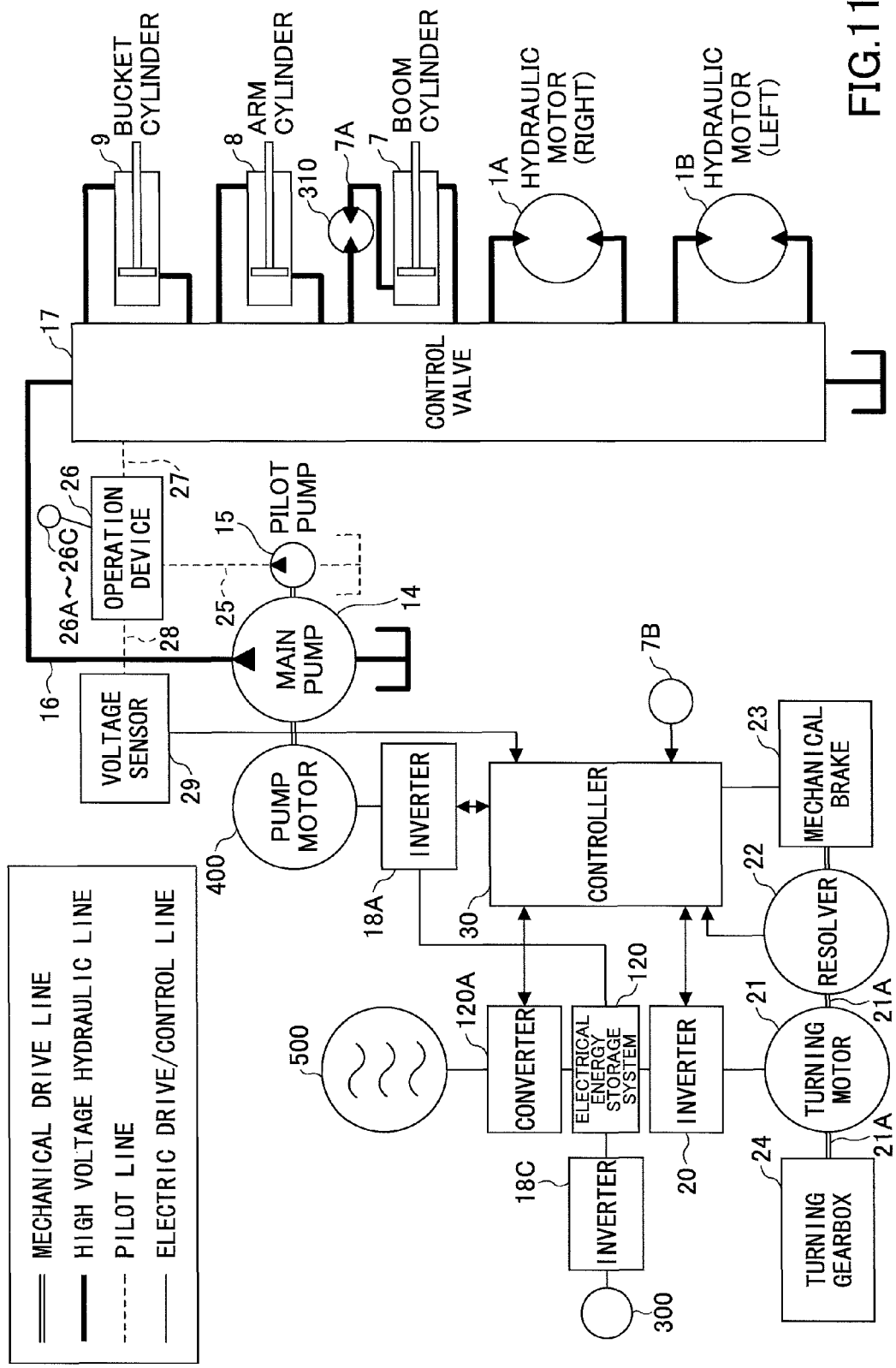
FIG. 11 is a block diagram illustrating a configuration of an electric excavator.

Also, the present invention is not limited to application to a hybrid excavator but may also be applied to an electric excavator as illustrated in FIG. 11, for example. The electric excavator illustrated in FIG. 11 does not have an engine and the main pump 14 is driven solely by a pump motor 400. The electric power for driving the pump motor 400 is supplied entirely by the electrical energy storage system 120. Specifically, the electrical energy storage system 120 is configured to be connectable to an external power source 500 via a converter 120A. The external power source 500 supplies power to the electrical energy storage system 120 to charge the electrical energy storage device included therein, and the electrical energy storage device supplies power to the pump motor 400.

It is noted that the present invention is not limited to the embodiments described above, and various changes and modifications may be made without departing from the scope of the present disclosure.

The present international application is based on and claims the benefit of priority of Japanese Patent Application No. 2011-016546, filed on Jan. 28, 2011, the contents of which are incorporated herein by reference in their entirety.

INDUSTRIAL APPLICABILITY

The present invention is applicable to an excavator that drives an electric work element with electric power from an electrical energy storage device.

DESCRIPTION OF REFERENCE NUMERALS

1 lower running body
1A, 1B hydraulic motors
2 turning mechanism
2A turning hydraulic motor
3 upper turning body
4 boom
5 arm
6 bucket
7 boom cylinder
7A hydraulic piping
7B boom angle sensor
8 arm cylinder
9 bucket cylinder
10 cabin
11 engine
12 motor generator
13 gearbox
14 main pump
15 pilot pump
16 high voltage hydraulic line
17 control valve
18A, 18C, 20 inverters
19 capacitor
21 turning motor
22 resolver
23 mechanical brake
24 turning gearbox
25 pilot line
26 operation device
26A, 26B levers
26C pedal
27 hydraulic line
28 hydraulic line
29 voltage sensor
30 controller
100 up-down voltage converter
110 DC bus
111 DC bus voltage detection part
112 capacitor voltage detection part
113, 116 capacitor current detection parts
114, 117 power supply lines
115, 118 connection points
120 electrical energy storage system
120A converter
130-1, 130-2 relays
300 generator
310 hydraulic motor
400 pump motor
500 external power source

The invention claimed is:

1. An excavator comprising:
an arm including an attachment;
a boom to which the arm is attached;
an upper turning body to which the boom is attached;
an engine arranged at the upper turning body;
an electrical energy storage unit including an electrical energy storage device that accumulates electric power generated by a generator and an electric circuit that controls a charge/discharge operation of the electrical energy storage device;
a voltage detection part that is arranged between the electrical energy storage device and the generator and is configured to measure a voltage of the electrical energy storage device;
a current detection part that measures a current flowing through the electrical energy storage device;
an abnormality detection part that detects an abnormality of the electrical energy storage unit;
a switching element that controls the charge/discharge operation of the electrical energy storage device; and
a breaker that interrupts a power supply line between the switching element and the electrical energy storage device;
wherein the abnormality detection part includes
an electrical energy storage state estimation part that obtains an estimation value of an electrical energy storage state of the electrical energy storage device based on a voltage detection value obtained by the voltage detection part and a current detection value obtained by the current detection part; and
an abnormality determination part that makes an abnormality determination based on the estimation value obtained by the electrical energy storage state estimation part;
wherein the abnormality detection part controls the switching element and the breaker based on an abnormality determination result of the abnormality determination part; and
wherein when an amount of change in a charge state of the electrical energy storage device is less than a first threshold value, the abnormality determination part stops operation of the switching element and controls the breaker to interrupt the power supply line.

2. The excavator as claimed in claim 1, wherein the abnormality determination part compares an amount of change in a charge state of the electrical energy storage device with the estimation value in making the abnormality determination.

3. The excavator as claimed in claim 1, wherein the abnormality detection part checks an electric conduction of the electrical energy storage unit during a first time period, and obtains the estimation value during a second time period that is longer than the first time period.

4. The excavator as claimed in claim 1, wherein when the amount of change in the charge state of the electrical energy storage device is greater than a second threshold value, the abnormality determination part controls operation of the switching element to restrict the current flowing through the electrical energy storage device.

5. The excavator as claimed in claim 1, wherein when the amount of change in the charge state of the electrical energy storage device is greater than or equal to the first threshold value and is less than or equal to a second threshold value, the abnormality determination part controls the breaker to refrain from interrupting the power supply line and controls the switching element to continue operation.

6. The excavator as claimed in claim 1, wherein when a ratio of a present value of an internal resistance of the electrical energy storage device to an initial value of the internal resistance is less than a third threshold value, the abnormality detection part notifies an operator of a fault condition.

7. The excavator as claimed in claim 1, wherein the abnormality determination part makes the abnormality determination based on the current detection value detected by the current detection part and the amount of change in the charge state of the electrical energy storage device.

8. The excavator as claimed in claim 1, wherein the abnormality detection part determines whether the abnormality determination part is to make the abnormality determination based on an integrated value of the current detection value detected by the current detection part.

9. The excavator as claimed in claim 1, wherein when the amount of change in the charge state of the electrical energy storage device is less than a fourth threshold value, the abnormality determination part stops operation of the switching element and controls the breaker to interrupt the power supply line.

10. A method of controlling an excavator that uses
an arm including an attachment;
a boom to which the arm is attached;
an upper turning body to which the boom is attached;
an engine arranged at the upper turning body;
an electrical energy storage unit including an electrical energy storage device that accumulates electric power generated by a generator and an electric circuit that controls a charge/discharge operation of the electrical energy storage device;
a switching element that controls the charge/discharge operation of the electrical energy storage device; and
a breaker that interrupts a power supply line between the switching element and the electrical energy storage device;
the method comprising the steps of:
obtaining an estimation value of an electrical energy storage state of the electrical energy storage device based on a voltage detection value of a voltage of the electrical energy storage device and a current detection value of a current flowing through the electrical energy storage device;
making an abnormality determination based on the obtained estimation value;
controlling the switching element and the breaker based on a result of the abnormality determination; and
stopping operation of the switching element and controlling the breaker to interrupt the power supply line when an amount of change in a charge state of the electrical energy storage device is less than a first threshold value.

11. The method as claimed in claim 10, further comprising comparing the amount of change in the charge state of the electrical energy storage device with the estimation value in making the abnormality determination.

12. The method as claimed in claim 10, further comprising checking an electric conduction of the electrical energy storage unit during a first time period, and obtaining the estimation value during a second time period that is longer than the first time period.

* * * * *